United States Patent [19]
Lukianoff et al.

[11] 3,961,190
[45] June 1, 1976

[54] VOLTAGE CONTRAST DETECTOR FOR A SCANNING ELECTRON BEAM INSTRUMENT

[75] Inventors: George V. Lukianoff, Hopewell Junction; Theodore R. Touw, Poughkeepsie, both of N.Y.

[73] Assignee: International Business Machines Corporation, Armonk, N.Y.

[22] Filed: Mar. 6, 1975

[21] Appl. No.: 556,044

[52] U.S. Cl. .................................. 250/310; 250/311
[51] Int. Cl.² ......................................... G01M 23/03
[58] Field of Search ............ 250/391, 310, 311, 305

[56] References Cited
UNITED STATES PATENTS

| | | | |
|---|---|---|---|
| 3,445,708 | 5/1969 | Webster | 250/305 |
| 3,474,245 | 10/1969 | Kimura et al. | 250/311 |
| 3,641,341 | 2/1972 | Jamba et al. | 250/397 |
| 3,694,652 | 9/1972 | Banbury et al. | 250/310 |
| 3,896,308 | 7/1975 | Venables et al. | 250/310 |

*Primary Examiner*—Alfred E. Smith
*Assistant Examiner*—B. C. Anderson
*Attorney, Agent, or Firm*—Thomas F. Galvin

[57] ABSTRACT

A directionally sensitive, high contrast secondary electron detector having a novel geometrical configuration for use in scanning electron microscopes and other electron beam instruments. The aperture of the detector which is placed near the specimen is in non-parallel arrangement with the aperture which admits the primary beam. The geometry of the detector provides for tilting of the specimen with respect to the incident primary electron beam to improve sensitivity and signal-to-noise ratio in comparison with prior detectors. In the preferred embodiment, the shape of the upper grid of the detector is substantially that of a conic section, thereby preventing space-charge build-up during operation.

17 Claims, 7 Drawing Figures

VOLTAGE CONTRAST DETECTOR FOR A SCANNING ELECTRON BEAM INSTRUMENT

FIELD OF THE INVENTION

This invention relates to the field of electron beam systems such as scanning electron microscopy. In particular it relates to directionally sensitive detectors of secondary electron emissions.

DESCRIPTION OF THE PRIOR ART

Directionally sensitive detectors have been used in the scanning electron microscope for the detection and mapping of secondary emission from the surface of the sample. The detectors reveal details due to non-uniformity of the topography or presence of voltages by analyzing secondary electron emission which is modulated by these factors. These details are unavailable when using the scanning electron microscope alone.

The basic form of such detectors was introduced in the article by Banbury and Nixon, "A High Contrast Directional Detector for the Scanning Electron Microscope", *J. Sci. Instr.*, 1969, Series 2, Volume 2, pages 1055–1059. The article describes the detector as having a cylindrical structure about the primary electron beam axis. The primary beam enters the detector via an aperture which is axially aligned with a second aperture at which the specimen is placed. A partial surface of the cylinder is a grid, near which is placed a scintillator followed by a photomultiplier tube for detecting secondary electrons emitted from the specimen which enter the detector chamber and exit through the grid. As compared to the detection methods prior to the Banbury and Nixon innovation, their detector improved the contrast from small topographical details on the specimen surface and made it possible to observe electric and magnetic microfields on and above it.

Quite recently, the use of secondary electron detectors in scanning electron microscopes has become common in the field of semiconductor technology. As is generally known, semiconductor devices have become substantially more complex, both with regard to circuit function, performance and the number of circuits per semiconductor chip. In 1965, for example, state-of-the-art commercially available devices contained one or two transistors per chip. A decade later, devices containing more than ten thousand devices per chip are commonplace. These modern semiconductor devices cannot be tested or analyzed in standard fashion.

It is often impractical and in some cases impossible, to physically contact the chip with conductive probes for electrical testing. Moreover, the detection and mapping of physical defects on and near the surface of the device, such as pinholes, scratches, cracked conducting layers, misalignment and so forth, is no longer feasible using optical techniques.

The scanning electron microscope, having a much greater resolution than optical systems operating in the visible portion of the electromagnetic spectrum, has become an invaluable tool, both in the laboratory as well as on the production line. When operated in the emission mode, the scanning electron microscope, (SEM) scans the semiconductor device with an electron beam and collects the secondary emission electrons from the specimen. An image is displayed on a cathode ray tube which is intensity-modulated by the electron detector. The result is a picture of the surface of the specimen with excellent depth of field and magnifications up to 100,000X. Pinholes, scratches, missing and cracked insulator overlays, missing metallization, misalignment and many other physical defects are observable in the SEM even when they may not be observable in a light microscope having a magnification of up to 1,000X.

Although the above-described Banbury and Nixon detector represented a breakthrough in scanning electron microscopy, it has certain disadvantages when used for failure analysis of semiconductor devices. In particular, the cylindrical shape of the detector has provided lower signal-to-noise ratio, secondary electron energy discrimination and overall sensitivity than is required.

SUMMARY OF THE INVENTION

It is, therefore, a primary object of our invention to increase the signal-to-noise ratio of secondary electron discriminators used in scanning electron instruments.

It is a further object of our invention to optimize the discrimination of secondary electron energy emitted on the specimens.

It is yet another object of our invention to improve the sensitivity of secondary electron discriminators.

These and other objects, advantages and features of our invention are achieved by a secondary electron discriminator having a unique geometrical configuration. The detector comprises an upper grid having an aperture for admission of the primary electron beam, a base plate having an aperture axially aligned with the primary beam aperture, a side wall partially enclosing the space between the upper grid and the base plate, and a front grid completing the enclosure of the space between the upper grid and the base plate. The base plate, or that portion of the base plate containing the second aperture, is in non-parallel relationship with the upper grid. With this arrangement the specimen may be placed in parallel with the second aperture but at an angle other than normal to the primary beam. This has increased substantially the signal-to-noise ratio over that which prior discriminators have achieved.

In the preferred embodiment of our invention, the shape of the major surface of the upper grid is substantially a conic section, such as a parabola, hyperbola or a portion of a semi-ellipse or semi-circle. These shapes produce an electric field distribution within the detector such that the force on an electron anywhere within the detector has a component directed toward the front grid, thus preventing electrons from accumulating and producing a space-charge region. In general, the less elongated the shape, the more pronounced is the electric field vector toward the front grid.

In another embodiment, the tilt angle, , between the bottom plate and the upper grid is variable to allow maximizing of discrimination for different types of specimens.

Although the utility of our novel discriminator will be described in terms of a scanning electron microscope, it has wider applications in many electron instruments. For example, it may be used both, in the manufacture of microminiature devices where on-line, real-time measurements are desired as well as in off-line defect detection.

DESCRIPTION OF THE PREFERRED EMBODIMENT

Figure 1:
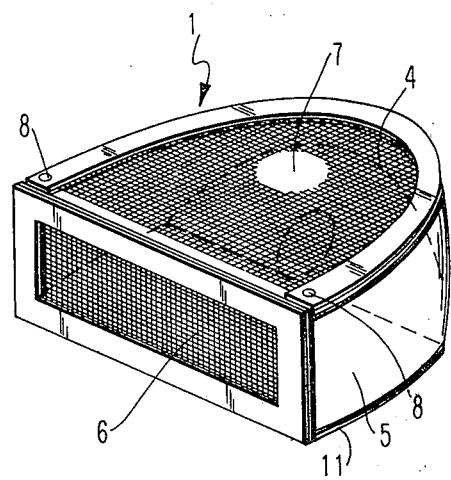
FIG. 1 is a perspective view of the preferred embodiment of our invention.

Referring now to FIG. 1, discriminator 1 comprises four principal components: an upper grid 4 in which is formed an aperture 7, a front grid 6, a sidewall 5 and a bottom plate 11. Axially aligned with aperture 7 is aperture 9 illustrated as formed in a folded portion of bottom plate 11. Upper grid 4, front grid 6, side plate 5 and base plate 11 are each electrically insulated from one another by appropriate insulating spacers 8, not shown in FIG. 1.

Figure 1A:
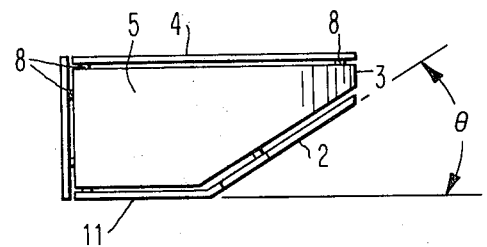
FIG. 1a is a side view of the embodiment shown in FIG. 1.

As previously discussed, a key aspect of our invention is the geometrical configuration of the discriminator which allows tilting of the specimen with respect to the incident primary electron beam. As shown in FIG. 1A, bottom plate 11 is folded so that the portion 2 containing aperture 9 is bevelled with respect to rear-section 3 of side-wall 5 and in non-parallel relationship with upper grid 4. The angle from parallel is illustrated as $\theta$. For a practical discriminator useful in testing semiconductor devices, an angle $\theta$ between 20°–80° is practical. Preferably, $\theta$ lies between 30°–50°.

Although plate 11 is illustrated as being partially parallel and partially non-parallel to upper grid 4, other arrangements are possible. For example, the entire bottom plate 11 may be planar and non-parallel to grid 4; however, for a given angle $\theta$, the sidewalls of discriminator 1 would have to be larger with this arrangement. Because a smaller discriminator allows both the use of smaller control voltages as well as more flexibility in the disposition of specimens in the vacuum chamber of a SEM, the folded shape of the discriminator in our preferred embodiment appears to be optimum.

In the broadest aspect of our invention, it is not required that base plate 11 be bevelled with respect to sidewall 5. Rather, the relative geometrical configurations of grid 4 and plate 11 could be reversed so that grid 4 is bevelled and plate 11 is planar and substantially normal with respect to sidewall 5. The critical aspect is that the axially aligned apertures 7 and 9 are non-parallel.

The non-parallel relationship of apertures 7 and 9 is most important as it allows a specimen both to be tilted with respect to the primary beam as well as to be placed in parallel with aperture 9. The tilt increases the signal-to-noise ratio; and the parallelism of the specimen with aperture 9 causes a maximum number of secondary electrons to be admitted into the discriminator.

As is well known, the total yield of secondary electrons from a specimen for a given primary beam increases with tilt angle. However, the noise component is insensitive to tilt — hence a higher signal-to-noise ratio is provided with tilt. On the other hand, the angular distribution of secondary emissions is predominantly *normal* to the specimen surface. Thus a tilted base plate aperture matches the angular distribution to take advantage of both characteristics.

Figure 2:
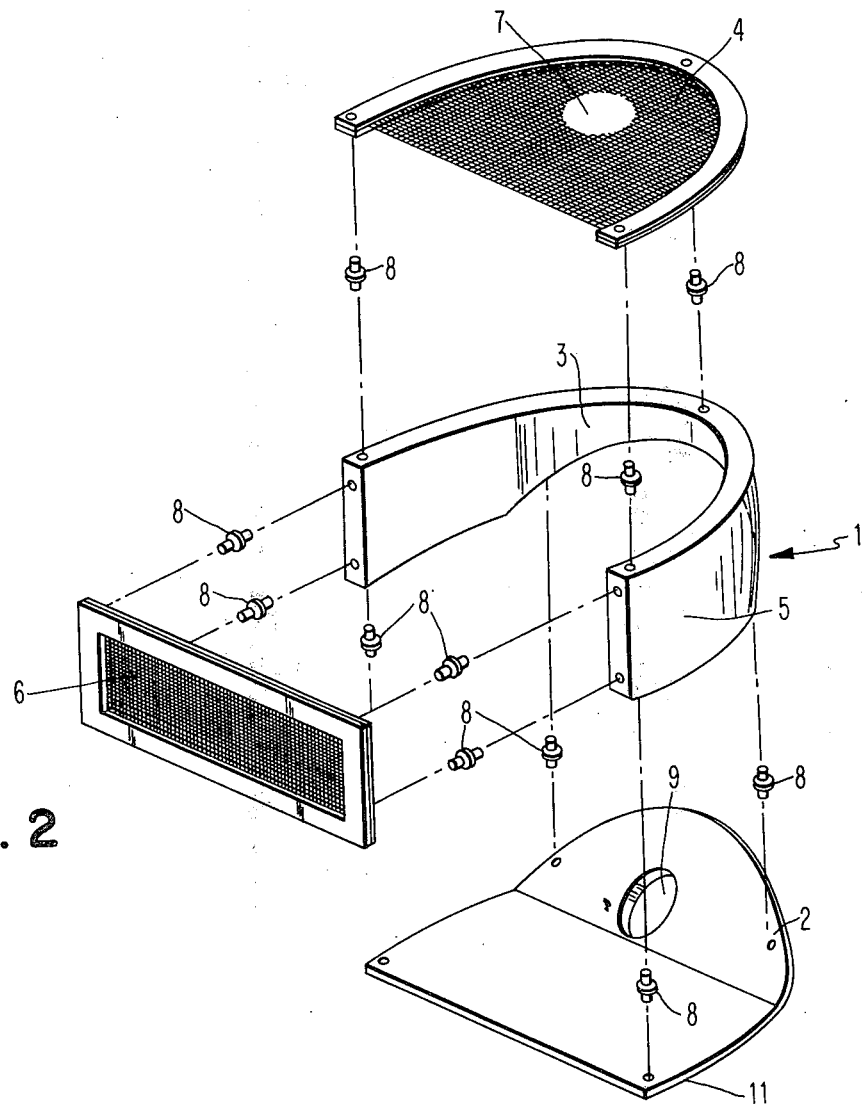
FIG. 2 is an exploded view of the embodiment shown in FIG. 1 to better illustrate the various components of the discriminator.

In FIG. 2, which is an exploded view of the preferred embodiment of our invention, it is seen that the discriminator comprises essentially four separate sections. Plastic spacers 8 are engaged by holes formed in the principal components to provide insulation between each of the components. Spacers 8 are preferably small and shaped so as not to protrude into the space enclosed by the principal components. Otherwise, charge could accumulate on the spacers when struck by secondary electrons, thereby distorting the field distribution.

Another important feature of the invention better illustrated in FIG. 2 is the geometrical configuration of upper grid 4, which has the shape of a parabola with sidewall 5 conforming thereto. Although this shape is most desirable, other conic sections such as a hyberbola would be satisfactory. As will be explained in greater detail in a succeeding section of this specification, the parabolic shape prevents the build-up of negative space-charge within the detector, which might occur during prolonged use in vacuum. This build-up could cause instability within the detector as well as an increasing, time-dependent loss of sensitivity.

It is noted at this point that the size of apertures 7 and 9 need not be, and generally will not be, the same; they need only lie on the same axis. The diameter of aperture 7 is chosen to be large enough to admit substantially all of the primary beam. The diameter of aperture 9 determines at the same time the number of secondary electrons which are collected and the area of the specimen which is accessible to be scanned by the primary beam. The latter diameter should be sufficiently small to avoid possible interference on the secondary emission from one portion of the specimen due to voltages present on another portion. For example, the electrodes atop modern semiconductor substrates are very close - in the order of a few micrometers. If aperture 9 were too large, it could admit secondary electrons emitted in directions less nearly normal and more nearly tangential to the specimen surface. Such secondary electrons are more influenced by voltages on electrodes surrounding the electrode on which the primary electron beam is focussed than are secondary electrons emitted in more nearly normal directions. Thus, if aperture 9 were too large, interference between different electrodes could result, especially if they were oppositely biased.

For the examination of typical semiconductor devices we have used diameters of 4 and 6 millimeters for apertures 7 and 9, respectively.

Our invention also comprehends a variable secondary emission aperture as described in the article by T. R. Touw entitled "Voltage-Contrast Detector for Scanning Electron Microscopy", IBM Technical Disclosure Bulletin, Vol. 15, No. 8, January, 1973, p. 2546.

Figure 3:
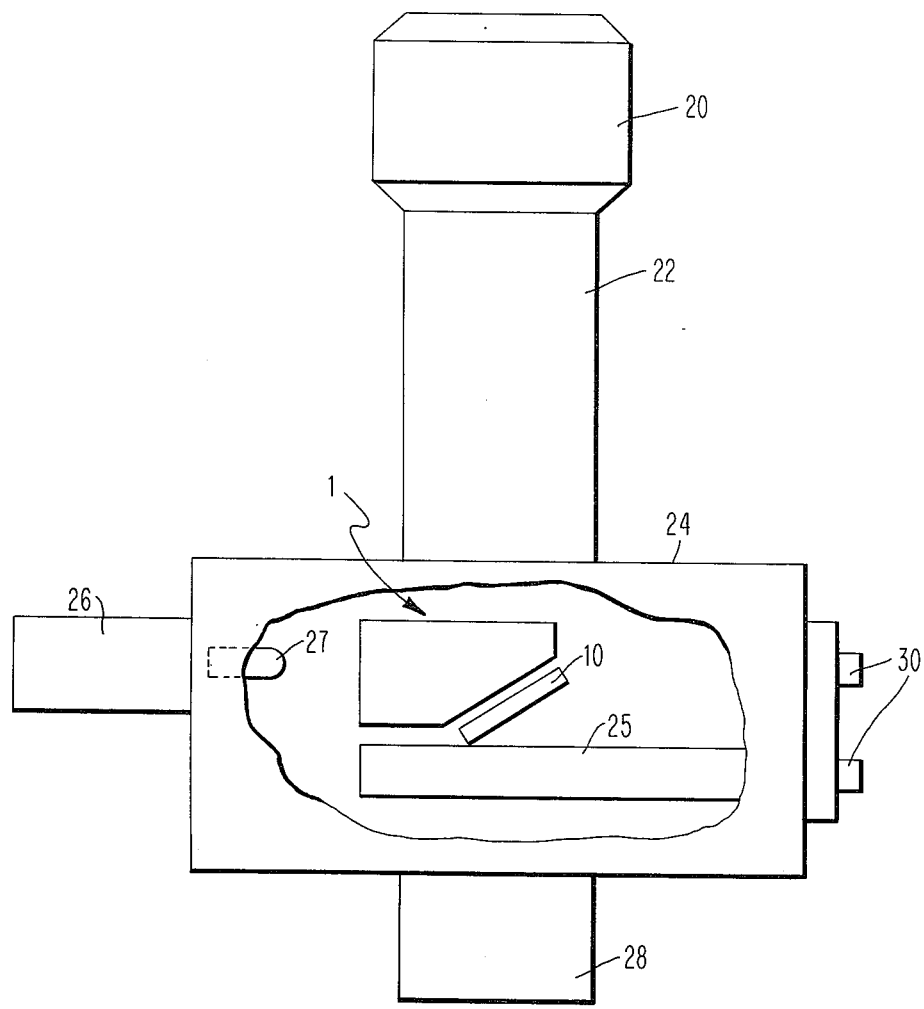
FIG. 3 illustrates a scanning electron microscope (SEM) system in which our invention has great utility.

Turning now to FIG. 3, our novel discriminator 1 is placed within the vacuum chamber 24 of a scanning electron microscope. Aside from the novelty of the discriminator design, there is nothing unique in the construction of the microscope. However, it will be useful in describing the operation of our invention in a typical environment and in conjunction with the other figures of the drawings. The microscope comprises electron gun 20, electron optical column 22, specimen chamber 24 and vacuum system 28. Within chamber 24 is a specimen stage 25 which is controllable in the X, Y and Z directions for selectively variable movement of specimen 10 by controller 30. A positively biased scintillator 27 is disposed in chamber 24 adjacent grid 6 of discriminator 1. Photomultiplier 26 is disposed outside chamber 24 for detecting electromagnetic radiation exited in scintillator 27 and transmitted through a light pipe and window in chamber 24 (not shown). As is well known to those involved in scanning electron microscopy, scintillator 27 acts as a highly efficient collector of secondary electrons emitted from specimen 10 and passed through discriminator 1.

Figure 4:
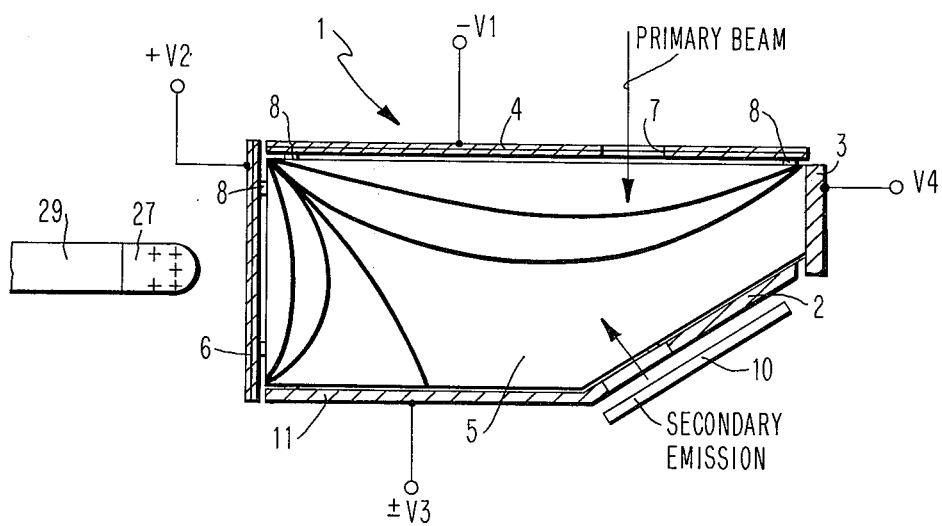
FIG. 4 is a side view of the electric potential distribution within our novel discriminator when appropriately biased.

FIG. 4 illustrates the electrostatic distribution of potentials within discriminator 1 when it is appropriately biased electrostatically by potentials V1, V2, V3 and V4, which are applied, respectively, to upper grid 4, front grid 6, lower plate 11 and sidewall 5. In practice, for work on semiconductor devices, typical values of these potentials are as follows: $V1 = -5$ to $-50$ volts; $V2 = 50$ to $300$ volts; $V3 = -15$ to $+15$ volts; V4 is grounded. Wider variations in potential are, of course, possible depending on the application. The field lines within the discriminator form three distinct functional spaces. The first, near aperture 9, controls the admission of the secondary electrons into the body of the discriminator. The second field discriminates between the secondary electrons in accordance with their energies. The third space attracts discriminator-selected secondary electrons through the body of the discriminator and grid 6 to scintillator 27.

The sensitivity of our novel detector is at least double that of the standard Banbury and Nixon detector described previously. We have used both detectors to test semiconductor devices in the SEM system illustrated in FIG. 3. The typical devices were 120 × 150 mil semiconductor logic and memory chips containing around 10,000 active devices and having two levels of metallization for interconnecting the circuits and for power distribution. This type of device is highly complex and densely packed with electrically conductive regions isolated from one another. As such, it is fairly representative of the forefront of the semiconductor art — the type of device which will probably be used for many years in the future.

Tests have been performed to compare the relative performance of our discriminator and the Banbury-Nixon device. Both were tested under identical conditions except for bias voltages applied to their electrodes, which were adjusted to obtain the best performance of each device. In one test comparing maximum sensitivity for specific voltages, the results were as follows:

TABLE I

|  | Maximum Sensitivity | Average Sensitivity | Relative Specimen Voltage Range |
| --- | --- | --- | --- |
| Banbury-Nixon | 2.6 millivolts/volt | 1.5 millivolts/volt | 12.8 volts |
| Present Device | 9.8 | 3.1 | 12.8 |

The difference in maximum sensitivity is a factor of 3.8. Sensitivity is generally defined as the response of the discriminator to a change in voltage applied to the specimen. With regard to Tables I and II, sensitivity is given in terms of the potential change in millivolts, across a fixed resistor at the output of the photomultiplier versus a change in the voltage in volts applied to the specimen. The relative specimen voltage ranges given are the ranges over which each response exceeded an arbitrary sensitivity limit of 0.6 millivolts/volt.

In another such test to compare sensitivities under conditions of maximum specimen voltage range, the results were as follows:

TABLE II

|  | Maximum Sensitivity | Average Sensitivity | Relative Specimen Voltage Range |
| --- | --- | --- | --- |
| Banbury-Nixon | 1.3 millivolts/volt | 1.1 millivolts/volt | 17.4 volts |
| Present Device | 3.7 | 2.3 | 20.6 |

In this experiment, the improvement in average sensitivity was a factor of 2.

Figure 5:
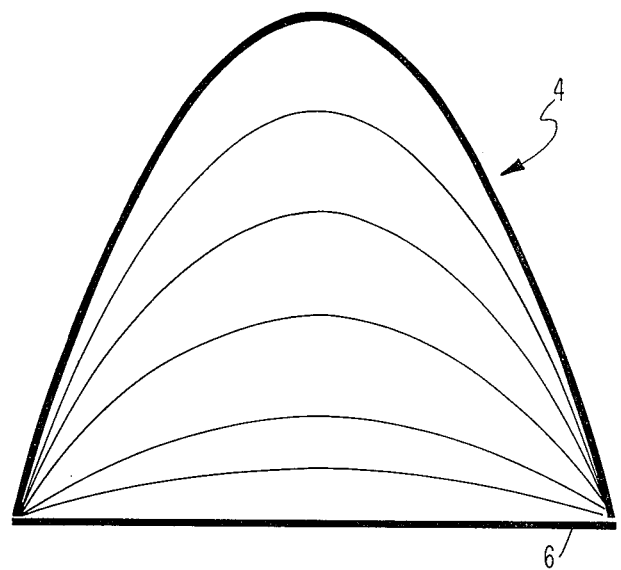
FIG. 5 is a top view of the electric potential distribution.

FIG. 5 illustrates by means of equipotential contours the electric field distribution inside discriminator 1 as it appears when viewed through the parabolically shaped upper grid 4. Because of the shape of the grid sidewall, the field is at all points directed toward front grid 6. Essentially, the field distribution is a series of contours, having the shape of the sidewalls, which gradually collapse into a straight line at grid 6. Thus, no space charge can build up within the discriminator.

As previously discussed, the shape of the upper grid is preferably that of a conic section such as a parabola or hyperbola. With this type of geometrical configuration, each section of the sidewall, as it extends from the apex, diverges from its corresponding opposite section on the other side of the apex. Therefore, a partial semi-ellipse or semi-circle also protects against space-charge build-up. Either a full semi-ellipse or full semi-circle would perform adequately for many purposes but are less desirable than the other configurations.

Figure 6:
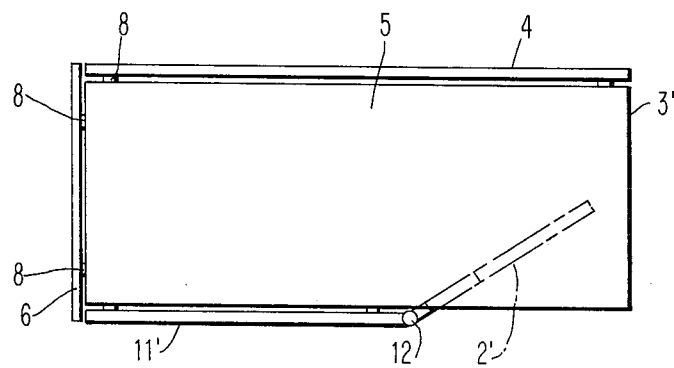
FIG. 6 is an alternate embodiment of our discriminator which provides for adjusting the tilt angle.

FIG. 6 represents an alternate embodiment of our invention which provides for varying the tilt angle of the bevelled (folded) portion of the discriminator. In this embodiment the folded portion of the sidewall 2' is rotatably mounted to base plate 11' by means of pivot pin 12. In this way plate 2', which has an aperture formed therein as described with respect to the preferred embodiment above is adjustable so that the inclination of the specimen which is mounted parallel to plate 2' with respect to the primary beam can be varied. Sidewall 5 is extended to completely enclose plate 2' throughout its swing limit.

While the invention has been particularly shown and described with reference to the preferred embodiments thereof, it will be understood by those skilled in the art, the foregoing and other changes in form and detail may be made therein without departing from the scope and spirit of the invention.

We claim:

1. In a directionally sensitive detector comprising a first major surface which includes an upper grid having an aperture for admitting a primary beam of electrons, a second major surface having a second aperture axially aligned with said first aperture for admitting secondary electrons from a specimen and a front grid partially defined the enclosure between said major surfaces, the improvement wherein:
   at least the portion of said major surfaces containing said apertures are in non-parallel arrangement with each other.

2. A detector as in claim 1 wherein the portion of said second major surface containing said second aperture is folded with respect to the remainder of said second major surface.

3. A detector as in claim 2 wherein said folded portion is rotatably mounted with respect to said remaining portion, whereby the angle between said primary beam and a specimen held in parallel with said folded portion may be selectively altered.

4. A detector as in claim 1 wherein the shape of said detector produces an electric field distribution such that the force on an electron anywhere within the detector has a component directed toward said front grid.

5. A detector as in claim 4 wherein the shape of said upper grid is a parabola.

6. A detector as in claim 4 wherein the shape of said upper grid is a hyperbola.

7. A detector as in claim 4 wherein the shape of said upper grid is a portion of a semi-ellipse.

8. A detector as in claim 4 wherein the shape of said upper grid is a portion of a semi-circle.

9. A detector as in claim 1 wherein said specimen is a semiconductor device.

10. A detector as in claim 9 wherein the angle between said major surfaces containing said apertures is between 30° and 50°.

11. A directionally sensitive detector comprising:
an upper grid having an aperture for admission of a primary electron beam;
a base plate having an aperture axially aligned with the primary beam aperture;
a sidewall partially enclosing the space between the upper grid and the base plate;
a front grid completing the enclosure of the space between the upper grid and the base plate;
at least the portion of the base plate containing said base plate aperture being in non-parallel arrangement with said upper grid.

12. A detector as in claim 11 wherein the angle between said base plate and said upper grid is variable.

13. A detector as in claim 11 wherein the shape of said upper grid is a parabola, thereby preventing build-up of negative space-charge within the detector.

14. A detector as in claim 11 wherein the shape of said upper grid is a hyperbola, thereby preventing build-up of negative space-charge within the detector.

15. A detector as in claim 11 wherein the shape of said upper grid is a portion of a semi-ellipse, thereby preventing build-up of negative space-charge within the detector.

16. A detector as in claim 11 wherein the shape of said upper grid is a portion of a semi-circle thereby preventing build-up of negative space-charge within the detector.

17. In a scanning electron microscope including an electron gun, electron optical column, specimen chamber, vacuum system and secondary electron detector comprising a first major surface which includes a grid having an aperture for admitting a primary beam of electrons, a second major surface having a second aperture axially aligned with said first aperture for admitting secondary electrons from a specimen and a front grid partially defining the enclosure between said major surfaces, the improvement wherein:
at least the portion of said major surfaces containing said apertures are in non-parallel arrangement with each other.

* * * * *